(12) United States Patent
Tallman et al.

(10) Patent No.: US 6,518,744 B1
(45) Date of Patent: Feb. 11, 2003

(54) GENERAL PURPOSE OSCILLOSCOPE HAVING DIGITAL TELEVISION SIGNAL DISPLAY CAPABILITY

(75) Inventors: James L. Tallman, Beaverton, OR (US); Erik Teose, Portland, OR (US); David A. Sailor, Boring, OR (US); Alex J. Barkume, Hillsboro, OR (US); Steven C. Herring, Beaverton, OR (US); Frederick Y. Kawabata, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/577,175

(22) Filed: May 23, 2000

Related U.S. Application Data

(60) Provisional application No. 60/191,679, filed on Mar. 23, 2000.

(51) Int. Cl.$^7$ .................................... G01R 13/20
(52) U.S. Cl. ................... 324/121 R; 324/158.1
(58) Field of Search .................... 324/121 R, 158.1; 348/448, 474, 575, 720, 721, 429; 345/133, 137

(56) References Cited

U.S. PATENT DOCUMENTS 5,287,092 A * 2/1994 Sharaishi ................ 345/137
5,485,199 A * 1/1996 Elkind et al. ............ 348/180
5,828,358 A * 10/1998 Monta et al. ............ 345/133

FOREIGN PATENT DOCUMENTS

EP 0738089 A 10/1996
GB 2266636 11/1993

* cited by examiner

Primary Examiner—Michael Sherry
Assistant Examiner—Paresh Patel
(74) Attorney, Agent, or Firm—Thomas F. Lenihan

(57) ABSTRACT

A portable general-purpose oscilloscope employs circuitry for receiving and converting serial digital video signals to composite and component analog signals via a digital to analog converter. The converted analog signals are applied to signal inputs of the oscilloscope for monitoring and display. Preferably, the oscilloscope is a digital phosphor oscilloscope. The oscilloscope control menus are arranged to control all of the usual functions of the oscilloscope and also to control the serial digital video circuitry. Apparatus is provided for storing data and waveforms. Circuitry is disclosed for deriving a trigger signal from a specific digital word of the serial digital bit stream. The trigger signal is applied to the trigger input terminal of the oscilloscope to allow the oscilloscope capture and display television waveform information around a unique occurrence of an event, as specified by the digital word. The serial digital to analog converter and decoder circuitry may be realized in a module that plugs into a receptacle in the oscilloscope. Separate modules may be provided for 601 video, HDTV signals, and DVB signals, and separate modules may be provided for NTSC, PAL, and SECAM television standards.

7 Claims, 7 Drawing Sheets

GENERAL PURPOSE OSCILLOSCOPE HAVING DIGITAL TELEVISION SIGNAL DISPLAY CAPABILITY

This Application claims the benefit of No. 60/191,619, field Apr. 23, 2000.

FIELD OF THE INVENTION

The subject invention generally concerns the field of general-purpose oscilloscopes, and in particular, concerns an apparatus and method for allowing such a general-purpose oscilloscope to display digital video signals in a meaningful way.

BACKGROUND OF THE INVENTION

General purpose oscilloscopes are high input impedance, waveform display and measurement instruments that, as the name implies, are not tailored to viewing any one specific kind of electronic signals, but rather, are equally well employed to view and measure signals in the digital or analog domains. Measurements are commonly made on signals in a range extending from D.C. through high RF.

In contrast, there is a special class of oscilloscopes, known as waveform monitors, that are tailored for viewing and measuring video (i.e., television) waveforms. Waveform monitors include dedicated hardware such as video sync detection circuitry and other television signal related functions, and excel at the task of analyzing television signals, but are so specialized that they can no longer be used to view other kinds of signals. That is, they are not intended to be used in conjunction with a common oscilloscope probe. Moreover, waveform monitors, unlike oscilloscopes, are not high input impedance measurement instruments, but rather are constrained to operate on a 1v p-p signal developed across a 75 ohm impedance.

It is well known that television signals may be encoded at a broadcast station into a standard format, such as NTSC, PAL, or SECAM, and then modulated onto an RF carrier for transmission. However, modern television broadcast stations need to convey video signals internally (i.e., routing of signals from location to location within the station) for processing, and the method of choice is to convert the analog video signals to serial digital form for such internal routing. The television industry serial digital standard most often used for this purpose is ITU-R 601 (hereinafter 601 video).

When a 601 video signal is viewed on a general-purpose oscilloscope, the waveform that one sees is that of an "eye diagram". An eye diagram indicates that an active digital signal is being observed (because one can see that the signal is changing between states, but the eye diagram conveys no content information at all. Being able to recognize video content is important when the probing is being done in conjunction with the repair of video equipment. It is also important when it is necessary to identify a particular signal as coming from a particular video source (such as a particular camera). Finally, being able to recognize video content is important when it is necessary to observe the "analog" signal levels that the digital video signal will exhibit upon conversion back to an analog signal. To illustrate this point, consider the following. A technician is probing a test panel comprising several different coaxial cables. Each of the cables is coupled to a 601 video signal source. The 601 video data stream is a 270 M-bit encoded bit stream (sometimes referred to as a "scrambled" bit stream by those in video technology). As noted above, viewing a 601 video waveform directly on a general purpose oscilloscope will produce only eye diagrams, and will not provide any useful information that would allow the technician to identify which cables are coupled to which sources.

Television engineers have addressed these problems in multiple ways, each way having drawbacks of its own. In a first arrangement, television engineers at an actual broadcast station combined a nine-inch television monitor, a Tektronix 465 analog oscilloscope, an AJA Digital to Analog Converter unit, and a Tektronix 1760 Video Analyzer, by literally strapping them together on a single oscilloscope cart to provide some modicum of mobility.

In a second arrangement, a Tektronix WFM90 waveform monitor was connected to an SDA601 (again, electrically and physically) to look at 601 video signals.

In a third arrangement, an AJA Digital to Analog Converter unit was coupled to a WFM90 waveform monitor.

These arrangements need to draw AC power from an AC receptacle, and by no stretch of the imagination could these combinations be called "portable", when the size and weight of the combinations of elements are taken into account. In addition, none of the arrangements permits making a hardcopy of the video picture, a hardcopy of a vector scope display, or a hardcopy of the video waveform. Moreover, the 1760 Video Analyzer and WFM90 analog waveform monitor have no capability for saving waveform data for later review.

Even if a more specialized waveform monitor, such as a Tektronix WFM 601, or a Tektronix VM 700 were to be substituted into the above-given arrangements, neither could provide mathematics capability for digital signal processing functions, because neither has the capability to receive and store waveforms (i.e. playback recorded waveforms). Moreover, there would still be no hardcopy capability.

It is important to note that none of the above-noted actual arrangements provides the capability to control all of the features from a single menuing system and remote control (gpib, RS232, or ethernet) port.

What is needed is a truly portable, battery-operated oscilloscope, having capability to monitor 601 video (or other forms of digital video such as HDTV and DVB), convert the signal to analog form, display it on the oscilloscope screen, provide hardcopy output, save and recall both data and setup parameters, and perform digital signal processing on the monitored video signals.

SUMMARY OF THE INVENTION

A portable general-purpose oscilloscope employs circuitry for receiving and converting serial digital video signals to composite and component analog signals via a digital to analog converter. The converted analog signals are applied to a signal input of the oscilloscope for monitoring and display. Preferably, the oscilloscope is a digital phosphor oscilloscope. The oscilloscope control menus are arranged to control all of the usual functions of the oscilloscope and also to control the serial digital video circuitry. Apparatus is provided for storing data and waveforms.

In a second embodiment of the invention, circuitry is provided for deriving a trigger signal from a specific digital word of the serial digital bit stream. The trigger signal is applied to the trigger input terminal of the oscilloscope to allow the oscilloscope to capture and display television waveform information around a unique occurrence of an event, as specified by the digital word.

In a preferred embodiment of the invention, the serial digital to analog converter is realized in a module that plugs into a receptacle in the oscilloscope.

In yet another embodiment of the invention, separate modules are provided for 601 video, HDTV signals, and DVB signals.

In a further embodiment, separate modules may be provided for NTSC, PAL, and SECAM television standards.

DETAILED DESCRIPTION OF THE INVENTION

Heretofore, in television engineering areas of interest, there has been a tradeoff in terms of oscilloscope capabilities. On the one hand (and as noted above), analog oscilloscopes have been the oscilloscopes of choice for television engineers because the persistence of the screen phosphors provides a "magnitude over time" display not available in digital storage oscilloscopes (DSOs). On the other hand, analog oscilloscopes, by their very nature, do not have access to the digital signal processing features found in digital oscilloscopes. The digital phosphor class of oscilloscopes (DPOs) recently introduced by Tektronix, Inc. of Beaverton, Oreg., apply a decay function to the signal samples as they are acquired, and produce a display which is remarkably analog-like. With the use of a DPO oscilloscope, it is now possible to view analog television signals, such as those encoded in the NTSC, PAL, and SECAM television industry systems, on a general purpose digital oscilloscope, yet display the waveforms in the analog-like form so familiar to television engineers. Advantageously, all of the digital processing features, for which digital oscilloscopes are prized, are also available on the DPO oscilloscope.

While the apparatus of the subject invention could be used with an analog oscilloscope, it is preferred that it be used in conjunction with a DPO oscilloscope, so that the digital processing functions of the DPO may be used in combination with the subject invention.

Figure 1:
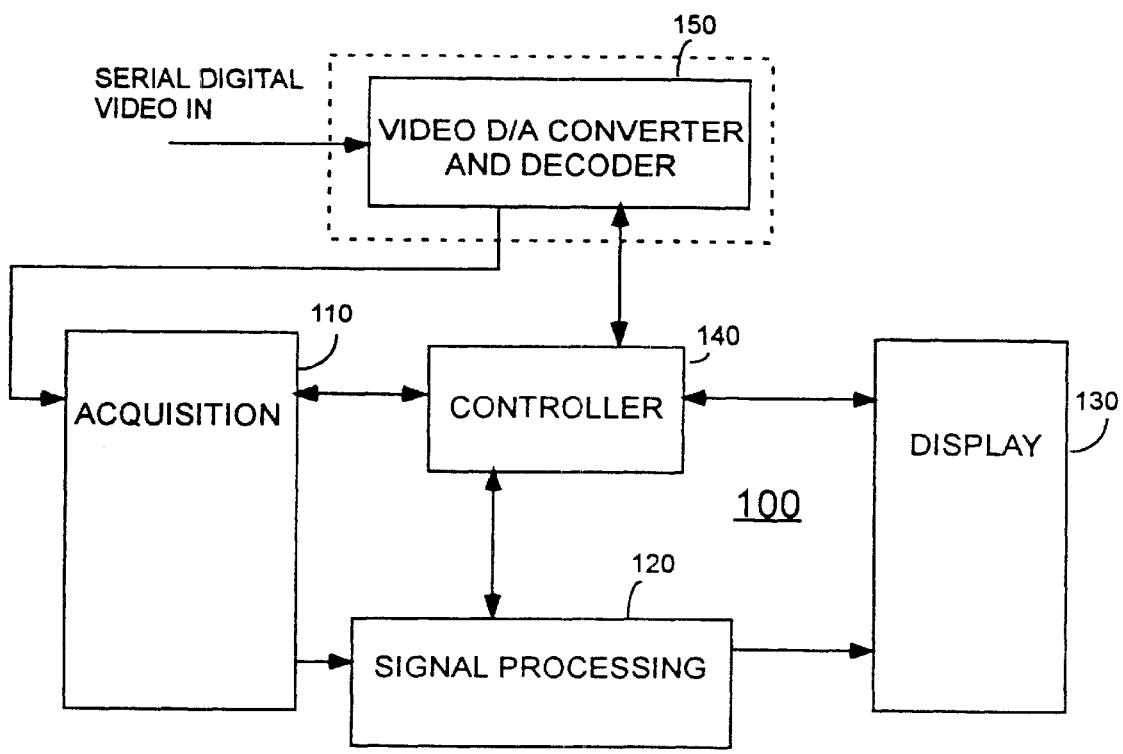
FIG. 1 shows, in block diagram form, apparatus useful for practicing the invention.

Referring to FIG. 1, a combination of a DPO oscilloscope 100, which may be a Tektronix TDS3000 series oscilloscope, and a Video D/A Converter and Decoder module 150, in accordance with the invention, are shown in highly simplified block diagram form. DPO oscilloscope 100 comprises an acquisition portion 110, a signal processing portion 120, and a display portion 130, all under control of a controller 140. Video D/A Converter and Decoder Module 150 receives serial digital video signals (which may be 601 Video, HDTV, DVB, or other digital video signals) at an input port, converts the serial bit stream to parallel format, decodes the signal information, and encodes that information as analog signals according to a particular television industry format (i.e., NTSC, PAL, SECAM). Preferably, Video D/A Converter and Decoder Module 150 is a plug-in module, adapted to interface with a receptacle already present on the TDS3000 series DPO oscilloscopes. Moreover, it is envisioned that Module 150 will obtain operating power from the DPO oscilloscope via the receptacle.

For simplicity, a single signal line is shown coupled from Video D/A Converter and Decoder Module 150 to DPO 100, in fact, multiple lines are envisioned depending upon output mode chosen, as will be described below. Note that Video D/A Converter and Decoder Module 150 also communicates with controller 140 via a digital bus.

Figure 2:
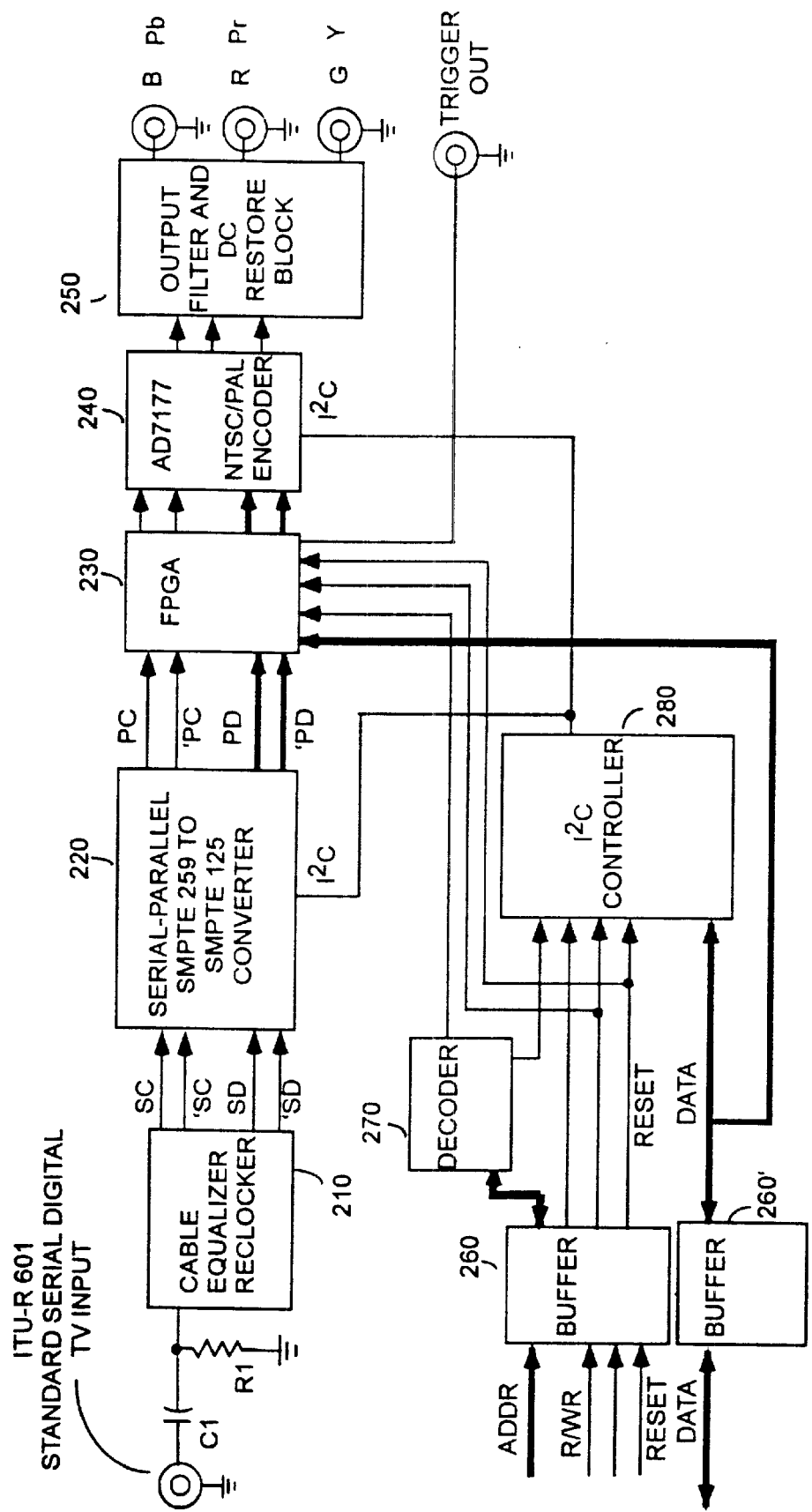
FIG. 2 shows circuitry suitable for use as the digital to analog converter and decoder of FIG. 1.

FIG. 2 shows a more detailed view of Video D/A Converter Module 150 of FIG. 1. Video signal flow is from left to right beginning across the top of FIG. 2. 601 video, for example, is received at the 75 ohm connector and is applied to a Cable Equalization Reclocker 210, which may be a GS9025, for example. Serial clock (SC, 'SC) and serial data (SD, 'SD) are then applied to a Television Signal Serial to Parallel Converter unit 220, which may be a GS9020. This unit converts the signals from the serial standard set forth in SMPTE 259 to the parallel standard set forth in SMPTE 125. The 10 bit parallel data (PD, 'PD) and parallel clock (PC, 'PC) signals are then applied to an FPGA (Field Programmable Gate Array) 230, which may be for example, a Xilinx XC4010. One of the tasks of the FPGA is to provide triggers on, for example, a particular line or word, on EAV (end of active video), SAV (start of active video), or TRS (timing reference signal).

The output signals from FPGA 230 are applied to inputs of an NTSC/PAL Encoder 240 which may be for example, an Analog Devices AD7177. The settings of NTSC/PAL Encoder 240 also determine the output mode. The modes are: Composite-Y/C, RGB, YPbPr, Vector Scope, Picture, or Eye Diagram. These modes are established via an I$^2$C bus. In this particular example of this particular module, SECAM format would not be available. The choice of NTSC or PAL formats is selectable via an I$^2$C bus under control of Controller 140 of FIG. 1.

The output signals of NTSC/PAL Encoder 240 are applied to inputs of an Output Filter and DC Restore Block 250 for appropriate filtering and DC restoration before being coupled to the signal measurement input terminals of DPO 100 via coaxial cables. Output filter and DC restore block 250 may be, for example, an EL4390 or an EL4581 integrated circuit.

Control signals and digital data signals are conveyed between the module of FIG. 2 and controller 140 via buffers 260 and 260', which may be for example 74LCX245 buffers, a decode unit 270, and an I$^2$C controller 280, which may be a PCF8584 controller. Decode unit 270 directs signals to either FPGA 230 or to I$^2$C controller 280.

Figure 3:
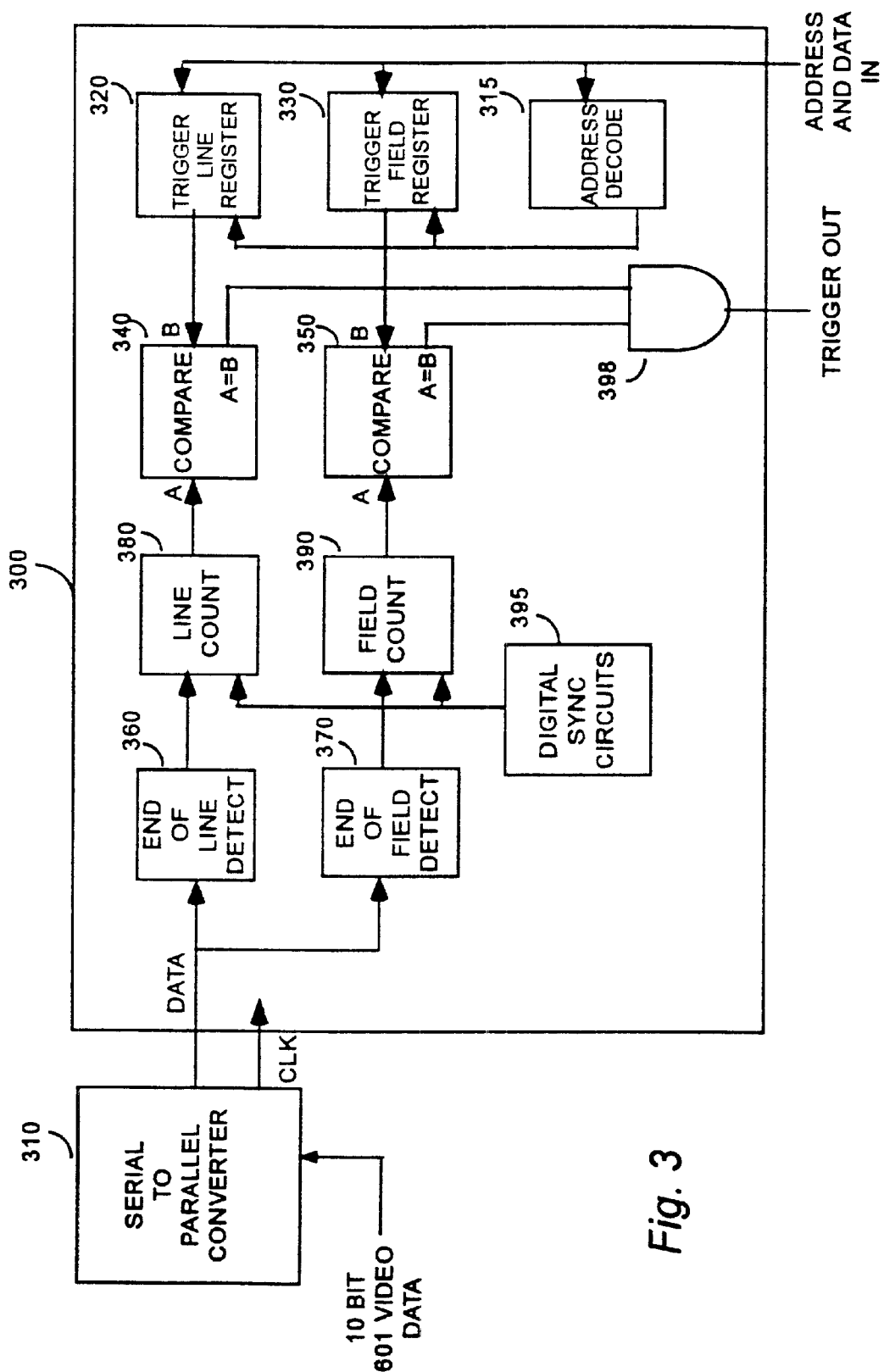
FIG. 3 shows circuitry for providing a trigger from a serial word in accordance with one embodiment of the invention.

FIG. 3 shows a trigger generator circuit 300 useful with the subject invention. Trigger generator 300 may be part of FPGA 240 of FIG. 2. Likewise, Serial to Parallel Converter 310 may be Serial to Parallel Converter unit 220 of FIG. 2, or it may be for example a Gennum GS9000. For simplicity, along the right side of FIG. 3, a single data line is shown applied to an Address Decoder 315, a Trigger Line Register 320, and a Trigger Field Register 330, but in fact, this line represents multiple digital parallel data and address lines. Via these address and data lines a particular field and line number may be stored in registers 320 and 330. Register 320 applies its stored line number to the B input of a binary compare unit 340, and Register 330 applies its stored field number to the B input of a binary compare unit 350. Digital Data from Serial to Parallel Converter 310 is applied to the inputs of an End of Line Detect unit 360, and to an End of Field Detect unit 370. At each occurrence of an End of Line or End of Field code, a pulse is produced at the output of the respective detector. The end of line pulses are applied to a Line Count unit 380 which applies a cumulative count to the A input of binary compare unit 340. The end of field pulses are applied to a Field Count unit 380 which applies a cumulative count to the A input of binary compare unit 350. Binary Compare units 340 and 350 produce an output when value at the A input equals the value at the B input. These output signals are applied to an AND-gate 398 which produces a trigger output for a specified line and field number. A digital Sync Circuits block 395 provides reset signals to Line and Field counters 380 and 390.

Thus, what has been described with respect to FIG. 3 is an apparatus for deriving a trigger signal from a serial digital video bit stream. While a television line and field trigger signal extraction arrangement was described in detail, the basic principals are the same for deriving a trigger from a particular word, that is, store the desired word to trigger on, and compare each word received against the stored word. When a match between the desired word and the received word occurs, a trigger pulse is generated. The trigger pulse is then coupled to DPO 100 via a coaxial cable to the normal trigger input on DPO 100.

Figure 4:
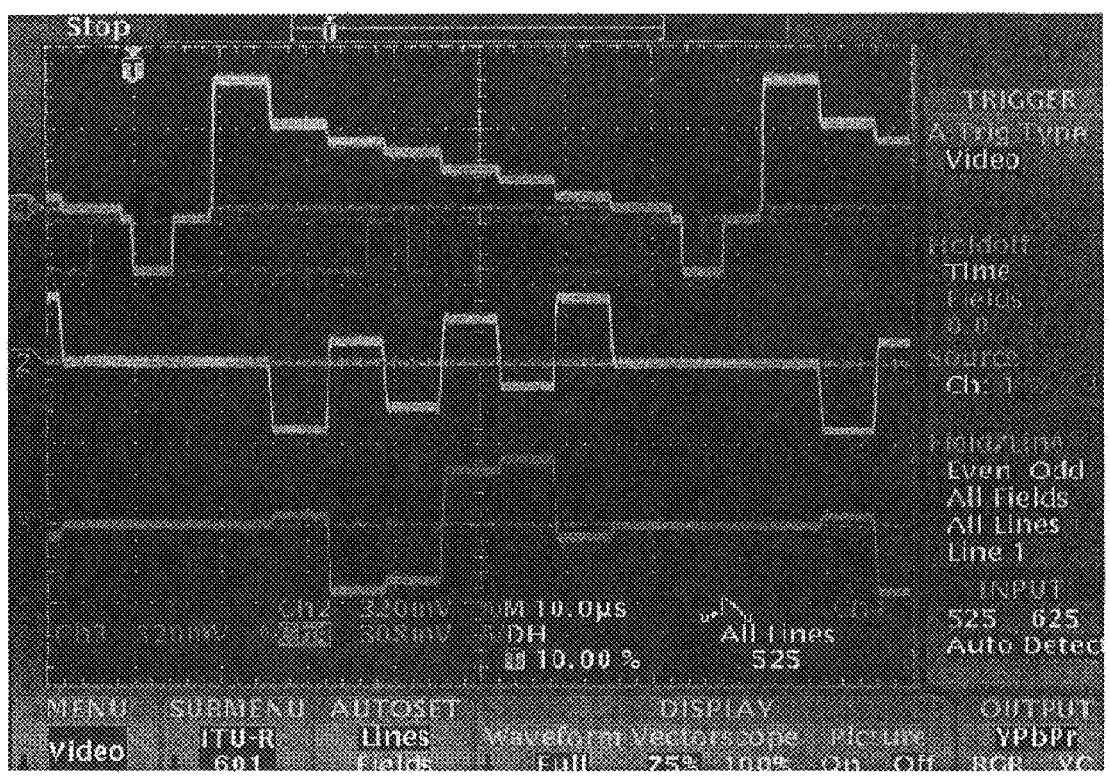
FIG. 4 is an illustration of an oscilloscope screen display of video waveforms and a menu in accordance with the subject invention.

The screen display of FIG. 4 shows video waveforms and menu selections for an oscilloscope employing the subject invention. The menu selections are highlighted by enclosing them in a black rectangle. Note that the Video Menu is active, that ITR-601 video mode is selected, and that the "Lines" mode of Autoset has been chosen, and the component signals being displayed are the YPbPr form of a 75% IRE analog video waveform derived from an ITU-R 601 digital video signal in accordance with the subject. The "Lines" mode of the Autoset feature automatically sets up the horizontal and vertical controls of the oscilloscope to display a full line of video in the proper vertical display range for a video signal. Other menu choices shown are the RGB and YC forms of component video. Note that when displaying waveforms, the "Picture on/off" selection is chosen to be "off".

Figure 5:
FIG. 5 is an illustration of an oscilloscope screen display of a video image and a menu in accordance with the subject invention.

FIG. 5 shows a mode in which the video image (i.e., picture) is displayed. The single bright horizontal line through the picture indicates the particular line (i.e., even line 226) chosen to be displayed if the user returns the oscilloscope to WAVEFORM mode of operation. Note that the "Picture on/off selection", in this case, is chosen to be "on".

Figure 6:
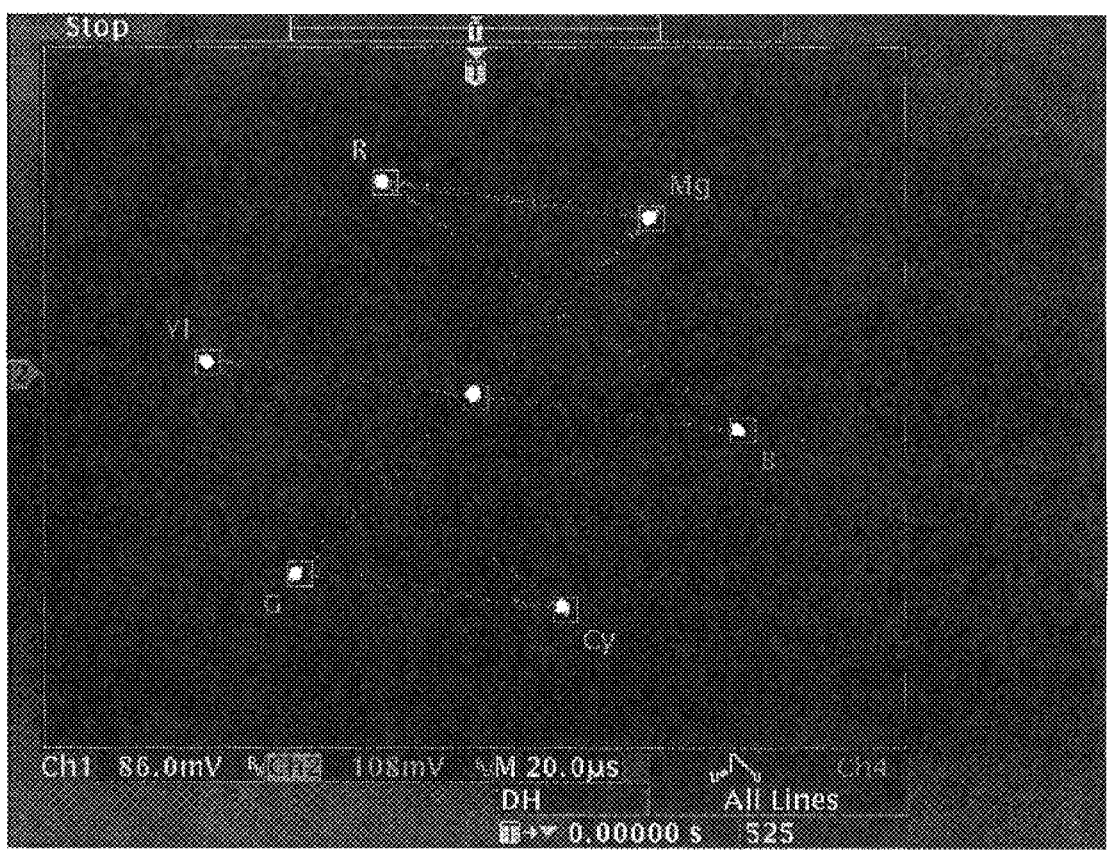
FIG. 6 is an illustration of an oscilloscope screen display of a vectorscope waveform and a menu in accordance with the subject invention.

FIG. 6 shows a vectorscope-style display for use in an oscilloscope according to the subject invention. In vectorscope mode two channels are used in X-Y mode of operation for plotting the color phase information derived from a video pattern signal. It is important to note that this feature is intended for use in a general purpose oscilloscope. Accordingly, the graticule and color legends cannot be permanently etched into the display screen but rather, must be generated for display along with the vectorscope diagram.

Figure 7:
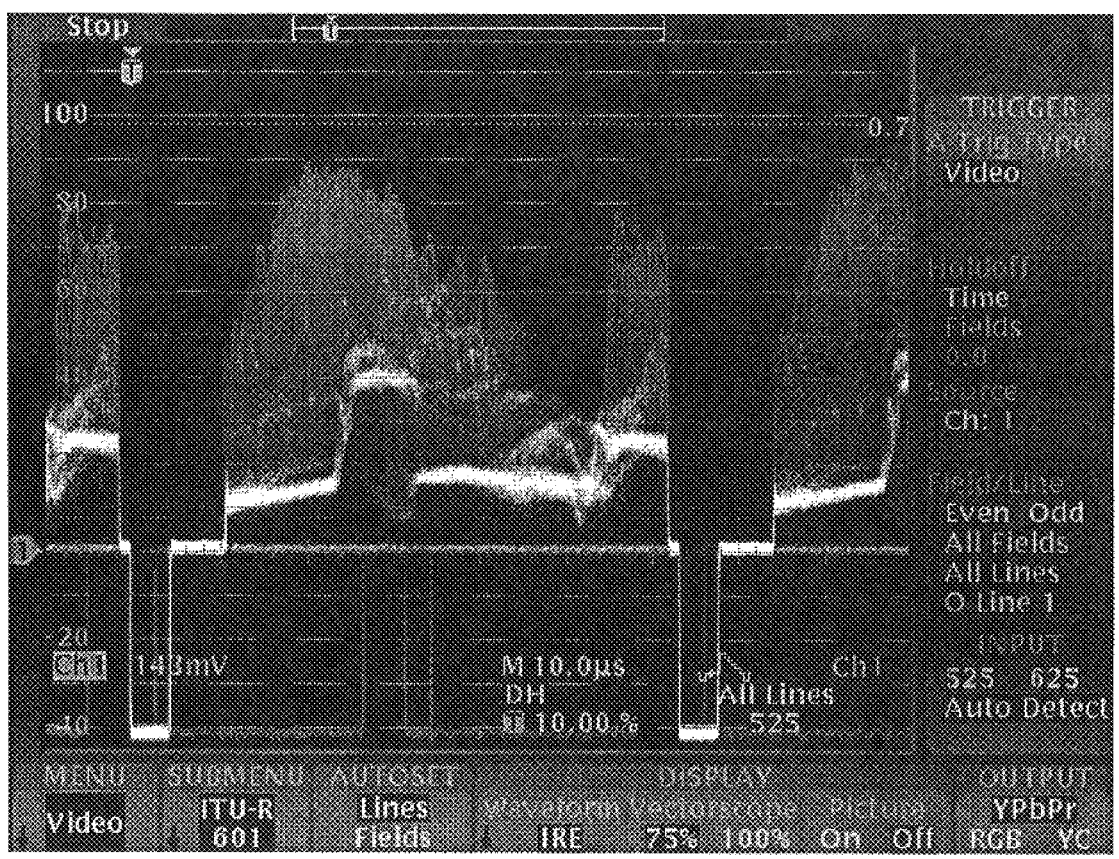
FIG. 7 is another illustration of an oscilloscope screen display of video waveforms and a menu in accordance with the subject invention.

FIG. 7 is a display of horizontal lines of a composite monochrome signal. Note that the trigger selection is "all lines". It should be noted that this particular signal happens to be from a monochrome video camera, but the system deals with color video signals, as well.

It is important to note that DPO 100 has the capability to store and recall setup parameters, and the capability to store and recall data. Thus, a single setup of all parameters necessary to create an NTSC signal from a 601 Video signal, including the ability to trigger on a specific television line and field, or display a vectorscope presentation, can be recorded for future recall and use. Moreover, it is envisioned that all control of the features of DPO 100 and the features of Serial Digital to NTSC/PAL module 150 can be accomplished through the use of the DPO on-screen menus. Thus, instead of having to manually program several different pieces of equipment, one can quickly and easily program DPO 100 and Module 150 to perform the task, and save the entire setup procedure in one step.

It should also be noted that DPO 100 has the capability to control the printing of screen displays of both waveforms and video images. In this manner, a complete report on a particular system can be documented as a test is being performed.

A further advantage of being able to restore and view data is that a "golden record" (an ideal waveform) may be stored and compared against a waveform from a device under test to generate a difference waveform for analysis. None of the previously mentioned waveform monitors is capable of such action because none can save and recall data.

The picture mode mentioned above refers to the capability of TDS3000 series oscilloscopes to display an image of the video picture being monitored. This feature is very valuable when trying to determine which cable is associated with which video source. This feature is explained in detail in copending U.S. patent application Ser. No. 09/293,048 entitled NON-LINEAR FILTER FOR EXTRACTING LUMINANCE COMPONENT FROM A COMPOSITE VIDEO SIGNAL (Gerlach and Tallman), and assigned to the same assignee as the subject application, and herein incorporated by reference.

The vector scope mode employs an X-Y display mode in DPO 100 to display vector scope diagrams in the usual manner. The proper vector scope graticule may be "drawn on" the face of the DPO display by appropriate software.

Thus, what has been described above is a truly portable, battery operated, DPO having the capability to display meaningful analog waveforms and images derived from a video serial digital bit stream. In a particularly useful embodiment, the invention includes a trigger generator circuit for deriving a trigger pulse at the occurrence of a particular television line and field.

While the invention has been described with respect to 601 video, it is herein recognized that the same problem occurs with respect to any video serial digital bit stream such as HDTV or DVB, and solutions to problems described herein involving such standards, are deemed to lie within the scope of the subject invention.

What is claimed is:

1. A general purpose oscilloscope, comprising:

an input for receiving signals for measurement and display;

processing circuitry for processing said signals;

display means for displaying a representation of said signals;

a controller for controlling said processing circuitry and said display means; and video processing circuitry for receiving serial digital video data signals, and providing analog video signals therefrom, for display on said oscilloscope, said video processing circuitry including:

serial to parallel converter circuitry for receiving said serial digital signals and providing representative parallel data signals at an output;

circuitry for receiving said parallel data signals and for selecting a mode of operation from a plurality of modes of operation, and for producing at its output modified parallel signal data, said mode of operation determining characteristics of said analog video signals, said selecting of said mode being accomplished under control of said controller; and circuitry for receiving and encoding said modified parallel signal data according to a selected television industry format, and producing said analog video signals at its output, said selecting of said television industry format being accomplished under control of said controller;

wherein said analog signals are couple to said input of said oscilloscope for processing and display;

and wherein:

said video processing circuitry is fabricated in a module, and said oscilloscope includes means for receiving said module, said module receiving operating power from said oscilloscope via connections of said receiving means.

2. The general purpose oscilloscope of claim 1 wherein said module is one of a plurality of modules, and each of said plurality of modules decodes a different form of said digital video signal.

3. The general purpose oscilloscope of claim 2 wherein said form of said digital video signal is ITU-R 601 video.

4. The general purpose oscilloscope of claim 2 wherein said form of said video signal is HDTV signals.

5. The general purpose oscilloscope of claim 1 further including apparatus for storing and recalling video waveforms for display and processing.

6. An oscilloscope, comprising:

an input for receiving signals for measurement and display;

processing circuitry for processing said signals;

display means for displaying a representation of said signals;

a controller for controlling said processing circuitry and said display means; and video processing circuitry for receiving serial digital video data signals, and providing analog video signals therefrom, for display on said oscilloscope, said video processing circuitry including:

serial to parallel converter circuitry for receiving said serial digital signals and providing representative parallel data signals at an output;

circuitry for receiving said parallel data signals and for selecting a mode of operation from a plurality of modes of operation, and for producing at its output modified parallel signal data, said mode of operation determining characteristics of said analog video signals, said selecting of said mode being accomplished under control of said controller; and circuitry for receiving and encoding said modified parallel signal data according to a selected television industry format, and producing said analog video signals at its output, said selecting of said television industry format being accomplished under control of said controller;

wherein said analog signals are coupled to said input of said oscilloscope for processing and display;

and wherein:

said video processing circuitry derives an analog signal from said digital video signals, which analog signal is suitable for displaying a vectorscope style of display representing the relative phases of color information in said analog signal, and said general purpose oscilloscope generates a suitable menu choice, graticule, and legend for said vectorscope display.

7. The general purpose oscilloscope of claim 6 further including apparatus for causing the printing of said vectorscope waveforms, said video waveforms, and said video images on a printer connected to said oscilloscope.

* * * * *